US010126615B2

(12) United States Patent
Kawata et al.

(10) Patent No.: US 10,126,615 B2
(45) Date of Patent: Nov. 13, 2018

(54) DISPLAY DEVICE

(71) Applicant: Japan Display Inc., Minato-ku (JP)

(72) Inventors: Yasushi Kawata, Tokyo (JP); Takumi Sano, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/364,815

(22) Filed: Nov. 30, 2016

(65) Prior Publication Data

US 2017/0176827 A1 Jun. 22, 2017

(30) Foreign Application Priority Data

Dec. 16, 2015 (JP) .................................. 2015-245375

(51) Int. Cl.
| G02F 1/1362 | (2006.01) |
| G02F 1/1333 | (2006.01) |
| G02F 1/1339 | (2006.01) |
| G02F 1/1343 | (2006.01) |
| H01L 27/12 | (2006.01) |
| G02F 1/1345 | (2006.01) |

(52) U.S. Cl.
CPC ...... *G02F 1/136227* (2013.01); *G02F 1/1339* (2013.01); *G02F 1/13394* (2013.01); *G02F 1/13439* (2013.01); *G02F 1/13452* (2013.01); *G02F 1/133345* (2013.01); *G02F 1/134309* (2013.01); *H01L 27/124* (2013.01); *G02F 2001/13396* (2013.01); *G02F 2201/123* (2013.01); *G02F 2201/42* (2013.01); *G02F 2202/28* (2013.01)

(58) Field of Classification Search
CPC ... G02F 1/13458; G02F 1/1345; G02F 1/1339
See application file for complete search history.

(56) References Cited

U.S. PATENT DOCUMENTS

2001/0024254 A1* 9/2001 Kwak .................. G02F 1/1345
349/122
2010/0316790 A1* 12/2010 Li .......................... G02F 1/1339
427/68

(Continued)

FOREIGN PATENT DOCUMENTS

| JP | 10-104651 | 4/1998 |
| JP | 10-189863 | 7/1998 |

(Continued)

*Primary Examiner* — Michael Caley
*Assistant Examiner* — Mariam Qureshi
(74) *Attorney, Agent, or Firm* — Oblon, McClelland, Maier & Neustadt, L.L.P.

(57) ABSTRACT

According to one embodiment, a display device includes a first substrate including an insulating substrate with a through hole, a first pad electrode disposed above the insulating substrate, and a signal line electrically connected to the first pad electrode, a second substrate disposed to be opposed to the first substrate, a first layer disposed between the first pad electrode and the second substrate, a wiring substrate including a connection line and disposed below the insulating substrate, and a conductive material disposed within the through hole to electrically connect the first pad electrode and the connection line, wherein the through hole is formed in a position overlapping the first layer.

17 Claims, 11 Drawing Sheets

(56) References Cited

U.S. PATENT DOCUMENTS

| | | | |
|---|---|---|---|
| 2011/0090445 A1* | 4/2011 | Kim | G02F 1/1339 349/139 |
| 2011/0266565 A1* | 11/2011 | Wang | G02F 1/1339 257/91 |
| 2012/0033162 A1* | 2/2012 | Ahn | G02F 1/1339 349/106 |
| 2013/0342779 A1* | 12/2013 | Jung | G02B 6/0083 349/43 |
| 2014/0033148 A1* | 1/2014 | Cohen | G06F 17/5068 716/112 |
| 2014/0361183 A1 | 12/2014 | Takeda et al. | |
| 2016/0219695 A1* | 7/2016 | Choi | H01L 51/0096 |

FOREIGN PATENT DOCUMENTS

| | | |
|---|---|---|
| JP | 2009-237410 | 10/2009 |
| JP | 2014-236209 | 12/2014 |

* cited by examiner

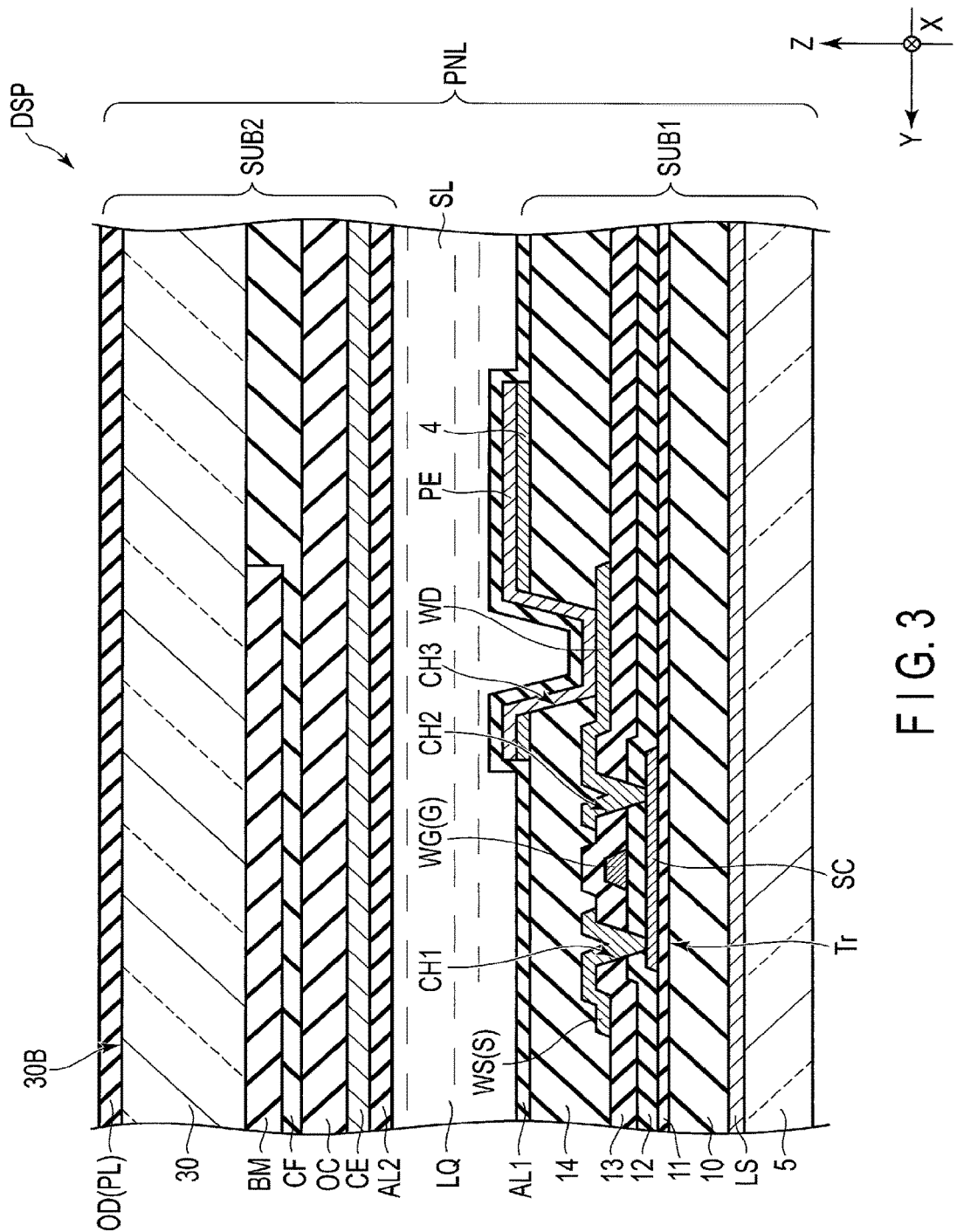
F I G. 3

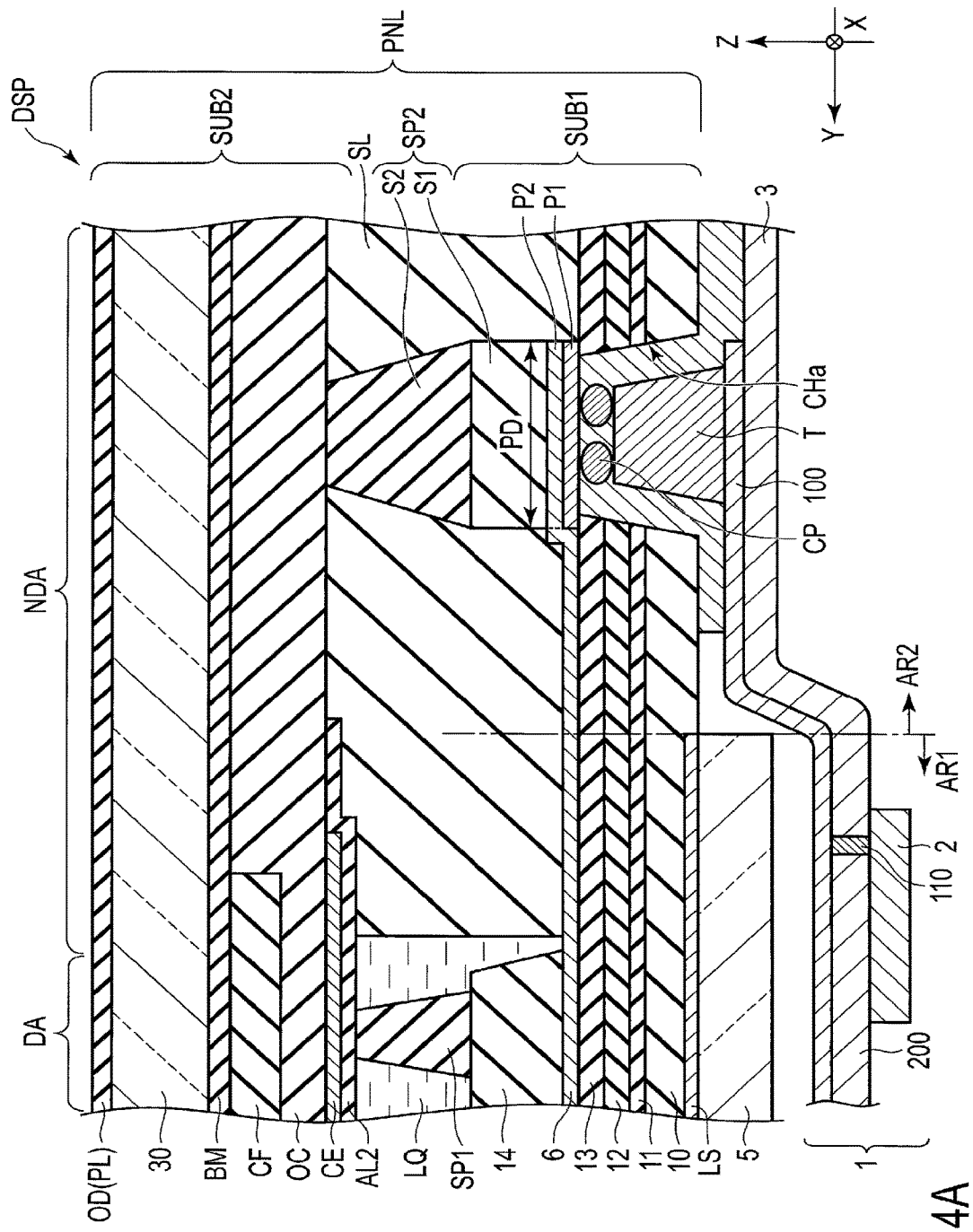
F I G. 4A

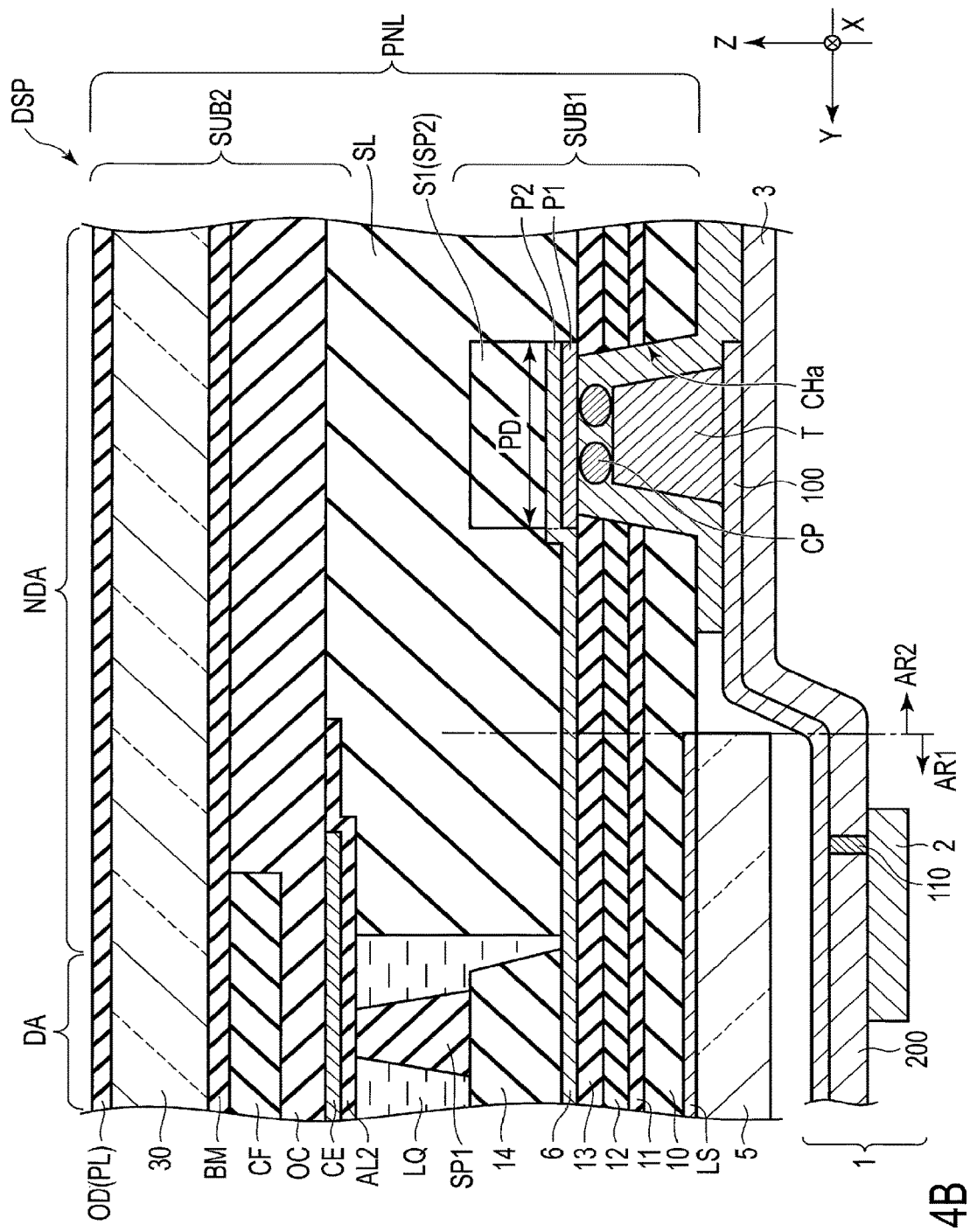
F I G. 4B

DISPLAY DEVICE

CROSS-REFERENCE TO RELATED APPLICATIONS

This application is based upon and claims the benefit of priority from Japanese Patent Application No. 2015-245375, filed Dec. 16, 2015, the entire contents of which are incorporated herein by reference.

FIELD

Embodiments described herein relate generally to a display device.

BACKGROUND

In recent years, display devices with a greater display area on the surface are highly anticipated because of higher performance and advanced design in the technical field of mobile data communication devices such as mobile phone and personal digital assistant (PDA). For example, display devices including a thinner bezel structure are proposed, which a driver is mounted in the periphery of the display area on the substrate including electrodes. In display devices using such a structure of the driver, input signals and voltages are supplied to the driver through a wiring substrate such as a flexible printed circuit (FPC). However, in consideration of greater production and thinner bezel structure, there has been a study to omit such a flexible printed circuit but to achieve an electrical connection between lines formed on the lower surface side of an array substrate and the driver formed on the upper surface side of the array substrate through a contact hole passing through the array substrate.

BRIEF DESCRIPTION OF THE DRAWINGS

FIG. 3 is a cross-sectional view of a display area of the display device of FIG. 1.

FIG. 4A is a cross-sectional view of the display device of FIG. 1 including a non-display area.

FIG. 4B is another cross-sectional view of the display device of FIG. 1 including a non-display area.

DETAILED DESCRIPTION

Figure 1:
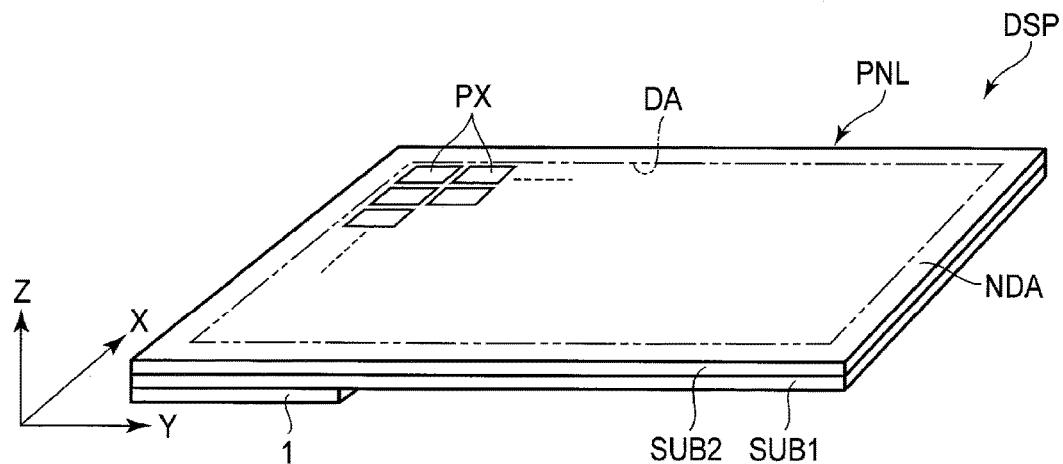
FIG. 1 is a schematic perspective view of the structure of a display device of an embodiment.

In general, according to one embodiment, a display device includes: a first substrate including an insulating substrate with a through hole, a first pad electrode disposed above the insulating substrate, and a signal line electrically connected to the first pad electrode; a second substrate disposed to be opposed to the first substrate; a first layer disposed between the first pad electrode and the second substrate; a wiring substrate including a connection line and disposed below the insulating substrate; and a conductive material disposed within the through hole to electrically connect the first pad electrode and the connection line, wherein the through hole is formed in a position overlapping the first layer.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc. of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless necessary.

Firstly, a display device of a present embodiment will be explained. FIG. 1 is a schematic perspective view showing the structure of a display device DSP of the present embodiment. FIG. 1 shows a three-dimensional space which is defined by a first direction X, second direction Y which is orthogonal to the first direction X, and third direction Z which is orthogonal to the first direction X and the second direction Y. Note that, in this example, the first direction X and the second direction Y are orthogonal to each other; however, they may cross at an angle other than 90°. Furthermore, in the present embodiment, the display device is a liquid crystal display device.

As shown in FIG. 1, the display device DSP includes a liquid crystal display panel PNL of active matrix type and a wiring substrate 1. The liquid crystal display panel PNL includes a plate-like first substrate SUB1, plate-like second substrate SUB2 opposed to the first substrate SUB1, and liquid crystal layer (liquid crystal layer LQ which will be described later) interposed between the first substrate SUB1 and the second substrate SUB2. Note that the liquid crystal display panel PNL of the present embodiment is a reflective-type liquid crystal display panel.

In the present embodiment, the positive direction of the third direction Z, that is, a direction from the first substrate SUB1 toward the second substrate SUB2 is defined as up or above, and the negative direction of the third direction Z, that is, a direction from the second substrate SUB2 toward the first direction SUB1 is defined as down or below.

The liquid crystal display panel PNL includes a display area DA in which an image is displayed and a non-display area NDA which surrounds the display area DA. The liquid crystal display panel PNL includes a plurality of pixels PX within the display area DA. The pixels PX are arranged in a matrix in the first direction X and the second direction Y.

In the example depicted, a side edge of the first substrate SUB1 which is parallel to the first direction X and a side edge of the second substrate SUB2 which is parallel to the first direction X have a substantially same length. Furthermore, a side edge of the first substrate SUB1 which is parallel to the second direction Y and a side edge of the second substrate SUB2 which is parallel to the second direction Y have a substantially same length. That is, an area of the first substrate SUB1 which is parallel to the X-Y plane is substantially the same as an area of the second substrate SUB2 in the X-Y plane. In the present embodiment, each side edge of the first substrate SUB1 matches each corresponding edge of the second substrate SUB2 in the third direction Z.

The wiring substrate 1 is disposed below the liquid crystal display panel PNL. In this example, a side edge of the wiring substrate 1 which is parallel to the first direction X has a length shorter than or equal to the side edges of the first substrate SUB1 and the second substrate SUB2 which are parallel to the first direction X. Furthermore, a side edge of the wiring substrate 1 which is parallel to the second direction Y has a length shorter than or equal to the side edges the first substrate SUB1 and the second substrate SUB2 which are parallel to the second direction Y. The wiring substrate 1 is disposed in both the non-display area NDA and the display area DA. In the present embodiment, a side edge of the wiring substrate 1 which is parallel to the first direction X matches an end of the liquid crystal display panel PNL in the third direction Z. Note that the wiring substrate 1 does not go outside the area opposed to the liquid crystal display panel PNL. The liquid crystal display panel PNL and the wiring substrate 1 are electrically connected to each other.

Figure 2:
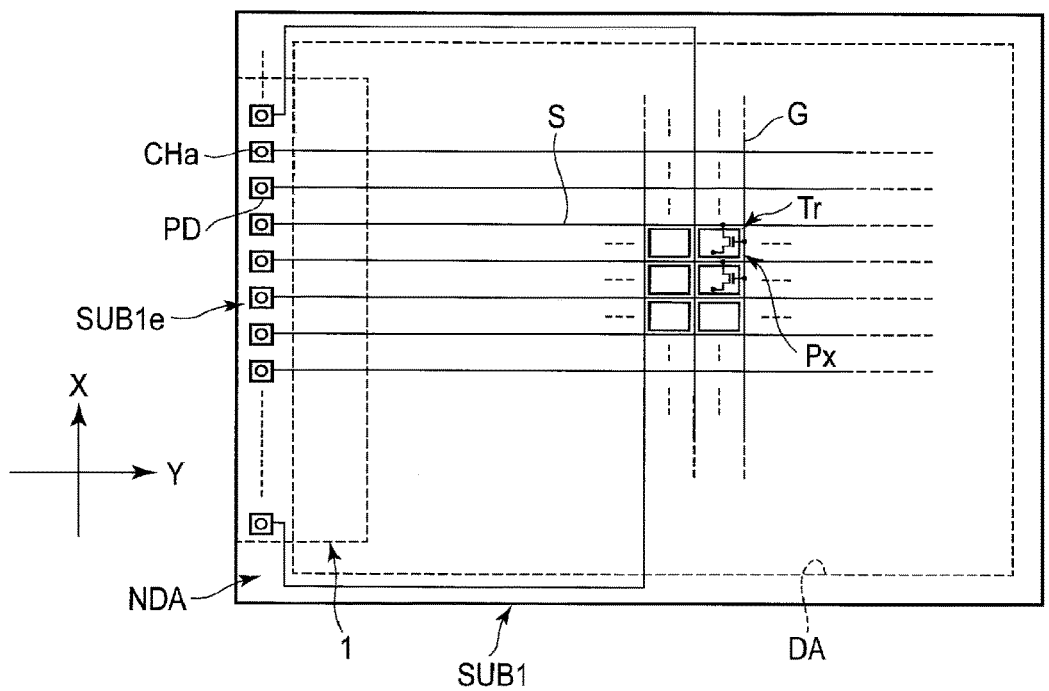
FIG. 2 is a schematic plan view of the first substrate of the display device of FIG. 1.

FIG. 2 is a schematic plan view of the first substrate SUB1 of the display device DSP of FIG. 1. As shown in FIG. 2, the first substrate SUB1 includes, in the display area DA, a plurality of gate lines G extending in the first direction X and arranged in the second direction Y, a plurality of source lines S extending in the second direction Y and arranged in the first direction X, and a thin film transistor Tr which is electrically connected to a gate line G and a source line S in each pixel PX. Each pixel PX is defined by two adjacent gate lines G and two adjacent source lines S. The thin film transistor Tr functions as a switching element.

The first substrate SUB1 includes an edge SUB1e in the non-display area NDA, in which a plurality of pad electrodes PD and a plurality of contact holes CHa are formed. Each pad electrode PD is formed to overlap a corresponding contact hole CHa. Each of the source lines S and the gate lines G is drawn to the non-display area NDA and is electrically connected to a corresponding pad electrode PD. The wiring substrate 1 is formed to at least partially overlap the edge SUB1e of the first substrate SUB1 as depicted with the dotted line in the figure. The wiring substrate 1 is, as described later, electrically connected to the pad electrode PD through the conductive material (which is not shown) in the contact holes CHa.

FIG. 3 is a cross-sectional view of the display area DA of the display device DSP of FIG. 1. Note that the example depicted in FIG. 3 shows a reflective liquid crystal display device using a twisted nematic (TN) mode.

As shown in FIG. 3, the first substrate SUB1 includes, for example, a support substrate 5, light shielding mask (light shield) LS, first insulating substrate 10, thin film transistor Tr, reflective layer 4, pixel electrode PE, and first alignment film AL1. The support substrate 5 is, for example, a glass substrate. The light shielding mask LS is disposed on the support substrate 5. The light shielding mask LS shields a laser beam. In the present embodiment, the light shielding mask LS is formed of a material which reflects a laser beam, and such a material reflects excimer laser or the like. The first insulating substrate 10 is disposed above the support substrate 5 and the light shielding mask LS. That is, the light shielding mask LS is disposed between the support substrate 5 and the first insulating substrate 10. The first insulating substrate 10 is formed of an organic insulating material such as polyimide. The first insulating substrate 10 is covered with a first insulating film 11.

The thin film transistor Tr is disposed above the first insulating film 11. In the example depicted, the thin film transistor Tr is structured top-gate type; however, it may be formed bottom-gate type. The thin film transistor Tr includes a semiconductor layer SC formed on the first insulating film 11. The semiconductor layer SC is covered with a second insulating film 12. The second insulating film 12 is disposed above the first insulating film 11.

A gate electrode WG of the thin film transistor Tr is formed on the second insulating film 12 to be directly above the semiconductor layer SC. The gate electrode WG is electrically connected to a gate line G (or formed integrally with the gate line G) and is covered with a third insulating film 13. Furthermore, the third insulating film 13 is disposed above the second insulating film 12.

The first insulating film 11, second insulating film 12, and third insulating film 13 are formed of an inorganic material such as silicon oxide or silicon nitride.

A source electrode WS and a drain electrode WD are formed on the thin film transistor Tr. Furthermore, the source line S is formed on the third insulating film 13. The source electrode WS is electrically connected to the source line S (or formed integrally with the source line S). The source electrode WS and the drain electrode WD are electrically connected to the semiconductor layer SC through contact holes CH1 and CH2 passing through the second insulating film 12 and the third insulating film 13. The thin film transistor Tr is covered with a fourth insulating film 14. The fourth insulating film 14 is disposed above the third insulating film 13. The fourth insulating film 14 is formed of an organic material such as transparent resin.

The reflective layer 4 is formed on the fourth insulating film 14. The reflective layer 4 is formed of a highly reflective metal material such as aluminum and silver. Note that the surface of the reflective layer 4 (that is, the surface in the second substrate SUB2 side) has an asperity for light dispersion.

The pixel electrode PE is formed on the fourth insulating film 14, and in the example depicted, it overlaps the reflective layer 4. Note that the reflective layer 4 can be formed at any position as long as it is opposed to the pixel electrode PE, and a different insulating film may be interposed between the pixel electrode PE and the reflective layer 4. The pixel electrode PE contacts the drain electrode WD of the thin film transistor Tr through a contact hole CH3 which passes through the fourth insulating film 14. The pixel electrode PE is formed of a transparent conductive material such as indium tin oxide (ITO) or indium zinc oxide (IZO). The pixel electrode PE is covered with the first alignment film AL1.

On the other hand, the second substrate SUB2 is disposed above the first substrate SUB1 and is opposed to the first substrate SUB1. The second substrate SUB2 includes, for example, a second insulating substrate 30, light shielding layer BM, color filter CF, overcoat layer OC, common electrode CE, second alignment film AL2. The second insulating substrate 30 is formed of a light transmissive material such as a glass substrate or a resin substrate.

The light shielding layer BM is formed on the second insulating substrate 30 to be opposed to the first substrate SUB1. The light shielding layer BM is formed to define each pixel PX to be opposed to the gate line G, and the source line S of the first substrate SUB1, the lines of the thin film transistor Tr, and contact hole CH3. The light shielding layer BM is formed of a light shielding metal material or a black resin material.

The color filter CF is formed on the second insulating substrate 30 to be opposed to the first substrate SUB1 and partly overlaps the light shielding layer BM. Color filters CF are formed of resin materials of different colors such as red, blue, and green. A red color filter corresponds to a red pixel, a green color filter corresponds to a green color pixel, and a blue color filter corresponds to a blue color pixel. Note that color filters CF may further include a white or a transparent color filter. Each boundary between color filters CF of different colors is disposed to be opposed to a light shielding layer BM.

The overcoat layer OC covers the color filter CF. The overcoat layer OC is formed of a transparent resin material.

The common electrode CE is formed on the overcoat layer OC to be opposed to the first substrate SUB1. The common electrode is formed of a transparent conductive material such as ITO or IZO. The common electrode CE is covered with the second alignment film AL2.

In the above-explained relationship of the first substrate SUB1 and the second substrate SUB2, the first alignment film AL1 and the second alignment film AL2 are disposed to be opposed to each other. Therein, a certain cell gap is formed between the first substrate SUB1 and the second substrate SUB2 with spacers (which are not shown). The first substrate SUB1 and the second substrate SUB2 are adhered together by a sealant (which is not shown) with a cell gap formed therebetween. The liquid crystal layer LQ is sealed within the first alignment film AL1 and the second alignment film AL2. An optical element OD including a polarizer PL is disposed on the external surface 30B of the second insulating substrate 30. The optical element OD is disposed on the display surface side.

FIG. 4A is a cross-sectional view of the display device DSP of FIG. 1 including the non-display area NDA. Note that the second substrate SUB2 here is structured substantially the same as the second substrate SUB2 of FIG. 3, and the detailed description thereof will be omitted. Furthermore, a view of the first substrate SUB1 from the second substrate SUB2 side is defined as a plan view.

As shown in FIG. 4A, the first substrate SUB1 and the second substrate SUB2 are adhered by a sealant SL. The liquid crystal layer LQ is disposed between the first substrate SUB1 and the second substrate SUB2 inside the area surrounded by the sealant SL. The sealant SL is formed in the non-display area NDA.

The support substrate 5 and the light shielding mask LS do not extend to the edge of the first substrate SUB1 and are cut halfway. That is, the support substrate 5 and the light shielding mask LS do not extend to the side edge of the first substrate SUB1 in the edge SUB1e side, which is shown in FIG. 2. Here, the first substrate SUB1 includes a first area AR1 and a second area AR2. The first area AR1, in a plan view, corresponds to the area where the support substrate 5 and the light shielding mask LS are disposed, and the second area AR2, in a plan view, corresponds to the area where the support substrate 5 and the light shielding mask LS are not disposed. The support substrate 5 and the light shielding mask LS overlap a part of the sealant SL in a plan view. The sealant SL is formed over the boundary of the first area AR1 and the second area AR2.

The pad electrode PD is formed above the first insulating substrate 10. In the example depicted, the first insulating film 11, second insulating film 12, and third insulating film 13 are disposed between the pad electrode PD and the first insulating substrate 10. Furthermore, in the example depicted, the pad electrode PD is a multilayer including electrodes P1 and P2. The electrode P1 is formed of, for example, indium tin oxide as a transparent conductive material. The electrode P2 is disposed above the electrode P1 and is formed of a conductive material such as a metal material. The electrode P2 is formed in, for example, an island shape. A contact hole CHa is formed passing through the first insulating substrate 10, first insulating film 11, second insulating film 12, and third insulating film 13 to reach the pad electrode PD. The pad electrode PD is formed in a position opposed to the contact hole CHa. The pad electrode PD and the contact hole CHa are, in a plan view, formed in the second area AR2 of the first substrate SUB1. Furthermore, the contact hole CHa is, in a plan view, formed at a position overlapping the sealant SL. Note that, in the present embodiment, the contact hole CHa corresponds to a through hole passing through the first insulating substrate 10, first insulating film 11, second insulating film 12, and third insulating film 13 to reach the pad electrode PD.

The signal line 6 is, in the example depicted, formed on the third insulating film 13 and is formed in the same layer where the pad electrode PD is disposed. The signal line 6 is electrically connected to the pad electrode PD. The signal line 6 and the pad electrode PD may be formed separately or integrally. In the example depicted, the signal line 6 is formed integrally with the electrode P2 of the pad electrode PD. The signal line 6 corresponds to the gate line G and source line S of FIG. 2, a power source line, and various control lines.

Note that, in the example depicted, the signal line 6 and the pad electrode PD are disposed in the same layer where the source line S is disposed; however, they may be disposed in a different layer. Furthermore, the signal line 6 and the pad electrode PD may be formed in different layers such that the signal line 6 and the pad electrode PD are electrically connected through a contact hole formed in an interlayer insulating film therebetween. In the example depicted, the fourth insulating film 14 is disposed above the signal line 6 in the area inside the sealant SL.

In the example depicted, the first substrate SUB1 further includes a first spacer SP1 and a second spacer SP2. The first spacer SP1 is disposed above the fourth insulating film 14 in the display area DA. The first spacer SP1 is disposed on the first substrate SUB1 to be opposed to the second substrate SUB2 and projects toward the second substrate SUB2. The first spacer SP1 forms a certain cell gap between the first substrate SUB1 and the second substrate SUB2. The first spacer SP1 is formed of a resin material based on, for example, acrylic resin.

The second spacer SP2 is formed on the pad electrode PD in the non-display area NDA and is disposed between the pad electrode PD and the second substrate SUB2. Furthermore, the second spacer SP2 is disposed in a position overlapping the contact hole CHa. The second spacer SP2 includes a first layer S1 and a second layer S2. In the example depicted, the first layer S1 is disposed on the pad electrode PD and the second layer S2 is disposed on the first layer S1 to project toward the second substrate SUB2. Furthermore, the second layer S2 contacts the second substrate SUB2. In the example depicted, the second layer S2 is tapered narrowing toward the second substrate SUB2. The first layer S1 is, for example, formed of the same material used for the fourth insulating film 14 through the same manufacturing process, and is formed of a material which is different from that used for the sealant SL. The first layer S1 and the second layer S2 may be, for example, a resin layer formed of a resin material. In the present embodiment, the first spacer SP1 and the second layer S2 are formed of, for example, a negative photosensitive acrylic resin. Note that, in the example depicted, the sealant SL is disposed in both the outside and the inside of the first layer S1.

Note that, if the second spacer SP2 is realized as a single spacer, it may be formed as a wall continuously extending in the first direction X. Or, if the second spacer SP2 is realized as a plurality of spacers, they may be formed as discontinuous walls. Or, if the second spacer SP2 is realized as a plurality of spacers, they may be formed as pillars scattered arbitrarily. The second spacer SP2 may overlap with at least a part of the pad electrode PD in a plan view.

Furthermore, as depicted, if the second spacer SP2 includes a plurality of layers, each of the layers can be formed of a material used for the insulating film formed in the display area DA through the same manufacturing process.

In the example depicted, the first spacer SP1 and the second spacer SP2 are formed to be tapered toward the second substrate SUB2; however, the shape of the first spacer SP1 and the second spacer SP2 is not limited to the example depicted, and they may be formed inversely to be tapered toward the first substrate SUB1. Furthermore, in the example depicted, the second spacer SP2 is formed on the first substrate SUB1; however, it may be formed on the second substrate SUB2.

The wiring substrate 1 includes a core substrate 200, a connection line 100 disposed on the surface of the core substrate 200 to be opposed to the liquid crystal display panel PNL, and driver 2 disposed on the surface opposite to the surface of the core substrate 200 to be opposed to the liquid crystal display panel PNL.

The connection line 100 includes a projection T. The projection T of the connection line 100 is formed in a position to overlap the contact hole CHa in a plan view. At least a part of the projection T is formed in the contact hole CHa. The projection T is, for example, formed on the connection line 100 through a plating method.

The driver 2 is electrically connected to the connection line 100 through a through hole 110 formed in the core substrate 200. The driver 2 functions as, for example, a signal supplier which supplies a signal to the liquid crystal display panel PNL for its drive. Note that the position of the driver 2 is not limited to the above, and it may be disposed on the surface of the core substrate 200 which is opposed to the liquid crystal display panel PNL.

The liquid crystal display panel PNL and the wiring substrate 1 are electrically connected and adhered together with an anisotropy conductive film 3 which is a conductive material. Specifically, the anisotropy conductive film 3 includes conductive particles CP dispersed in an adhesive agent. When the anisotropy conductive film 3 is interposed between the wiring substrate 1 and the liquid crystal display panel PNL, they are pressed vertically in the third direction Z and heated to achieve electrical and physical connection therebetween. The anisotropy conductive film 3 is, between the liquid crystal display panel PNL and the wiring substrate 1, filled inside the contact hole CHa from the lower surface of the first insulating substrate 10 to contact the first electrode P1 of the pad electrode PD. Furthermore, the anisotropy conductive film 3 contacts the projection T of the connection line 100. Thereby, the connection line 100 is electrically connected to the pad electrode PD and the signal line 6 through the anisotropy conductive film 3.

Specifically, the conductive particles CP in the anisotropy conductive film 3 are, in the contact hole CHa, interposed between the pad electrode PD and the projection T. With the projection T of the connection line 100, when the wiring substrate 1 is pressed to the liquid crystal display panel PNL, the conductive particles CP are crushed between the pad electrode PD and the projection T to establish electrical connection therebetween. The conductive particles CP may be entirely formed of a metal material or may be formed of a resin material with metal coating of nickel or gold.

The projection T is opposed to the anisotropy conductive film 3 and the second spacer SP2 in the third direction Z. Here, strength of a material can be measured with a Young's modulus. The conductive particle CP of the anisotropy conductive film 3 has Young's modulus A, the projection T has Young's modulus B, and the second spacer SP2 has Young's modulus C. Here, Young's modulus B of the projection T is greater than Young's modulus A of the conductive particle CP and is less than Young's modulus C of the second spacer SP2.

In the present embodiment, the projection T, anisotropy conductive film 3, and second spacer SP2 are opposed to each other in the third direction Z. The projection T is disposed in a position overlapping the contact hole CHa. When the strengths of the second spacer SP2, projection T, and conductive particle CP are compared, the strength of the second spacer SP2 is greater than the others, the strength of the projection T is less than the strength of the second spacer SP2, and the strength of the conductive particle CP is less than the others. Therefore, when the wiring substrate 1 is pressed to the liquid crystal display panel PNL, the conductive particle CP is crushed by the pressure force from the projection T while the second spacer SP2 is relatively unchanged by the pressure force from the projection T and the conductive particle CP. That is, the strength between the first substrate SUB1 and the second substrate SUB2 with respect to the force applied in the third direction Z can be increased in the position where the wiring substrate 1 is pressed to the liquid crystal display panel PNL, that is, the position where the contact hole CHa is formed. Therefore, damage to the liquid crystal display panel PNL can be suppressed and the conductive particles CP can easily be deformed along the shape of the projection T.

Furthermore, since the second spacer SP2 is disposed in a position overlapping the contact hole CHa, the sealant SL is not disposed in a position overlapping the contact hole CHa, and thus, there is no need of selecting a material for the sealant SL in consideration of its Young's modulus. Therefore, a material for the sealant SL can be selected from broader choices and adhesion of the sealant SL can be improved. Furthermore, when the adhesion of the sealant SL is improved, an application area of the sealant SL can be reduced, and the non-display area NDA can be reduced accordingly. Furthermore, since the sealant SL is not necessarily applied to overlap the contact hole CHa, a loss of production caused by misapplication of sealants SL can be suppressed.

Furthermore, in the present embodiment, the display device DSP includes the wiring substrate 1 disposed below the liquid crystal display panel PNL (in the rear surface side which is opposite to the display surface) wherein the wiring substrate 1 and the liquid crystal display panel PNL are electrically connected through the conductive material (anisotropy conductive film 3 in the above example) in the contact hole CH in the second area AR2. Furthermore, the driver 2 is disposed below the liquid crystal display panel PNL. Since the area of the first substrate SUB1 is not required to be enlarged to mount the driver 2 or the wiring substrate 1 thereon, the first substrate SUB1 and the second substrate SUB2 can be formed substantially even. Furthermore, in the area where the first substrate SUB1 and the second substrate SUB2 are opposed to each other, the active area ACT can be increased. That is, in the display surface of the display device DSP of the present embodiment, the area of the active area ACT used for display can be increased, and a thinner bezel structure can be achieved.

Furthermore, since there is no need of a long flexible printed circuit used for the electrical connection between the part of the first substrate SUB1 which is opposed to the second substrate SUB2 and the wiring substrate 1, or a space to accommodate a bent flexible printed circuit, the display device DSP can be miniaturized. Furthermore, an electronic device including the display device DSP can be miniaturized, too.

Furthermore, since a possible breakdown of the lines when the flexible printed circuit is bent can be avoided, the display device DSP can be more reliable.

FIG. 4B is another cross-sectional view of the display device of FIG. 1 including a non-display area. As compared to the liquid crystal display panel PNL of FIG. 4A, the structure of the second spacer SP2 is different in the liquid crystal display panel PNL of FIG. 4B.

In the example of FIG. 4B, the second spacer SP2 includes the first layer S1 alone and does not include a second layer S2. Furthermore, the sealant SL is interposed between the first layer S1 and the second substrate SUB2. As above, the second spacer SP2 may be a monolayer and may not contact the second substrate SUB2.

Figure 5:
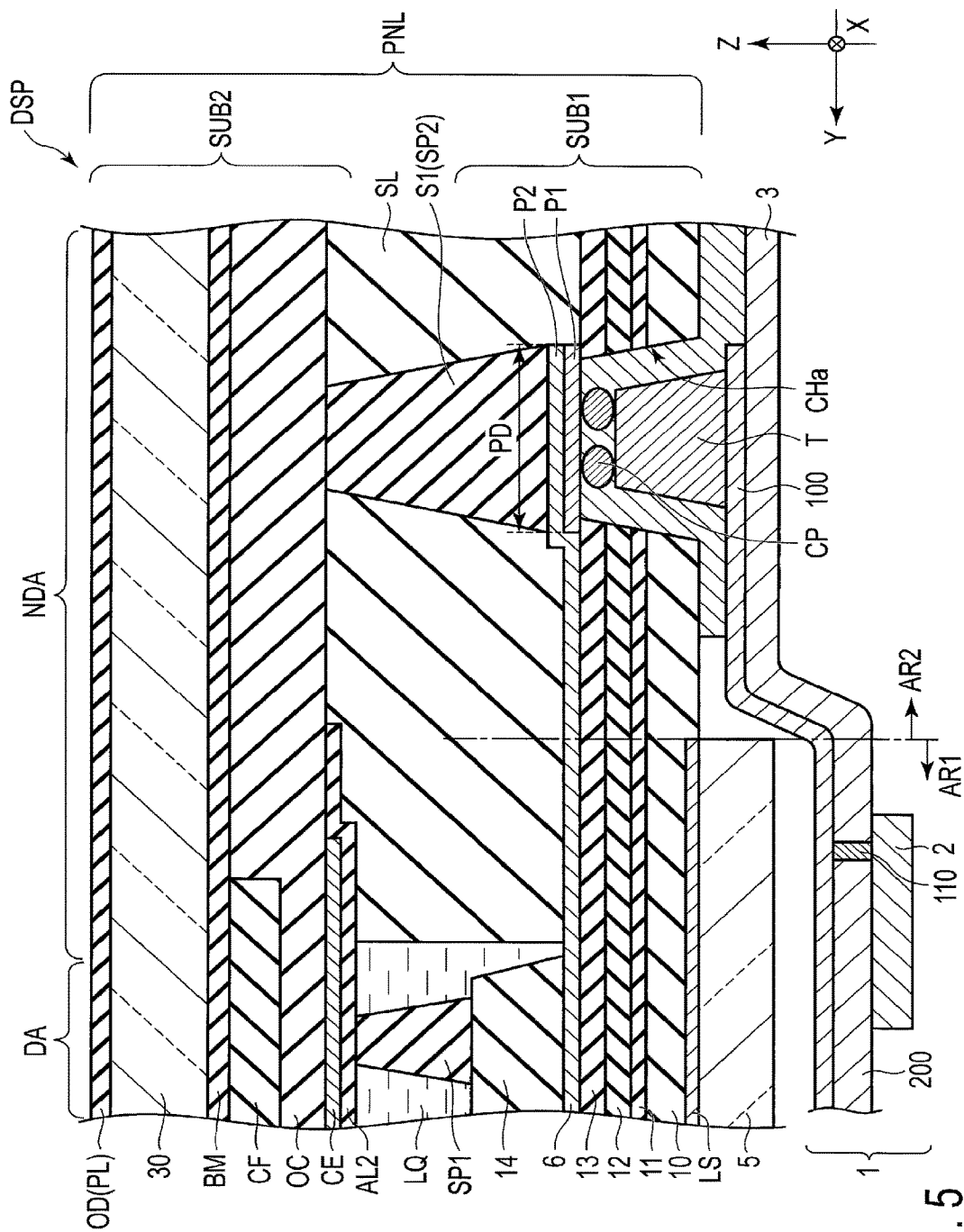
FIG. 5 is a cross-sectional view of a variation of the display device of the embodiment.

FIG. 5 is a cross-sectional view of a variation of the display device DSP of the embodiment. As compared to the liquid crystal display panel PNL of FIG. 4A, the structure of the second spacer SP2 is different in the liquid crystal display panel PNL of FIG. 5.

In the example of FIG. 5, the second spacer SP2 includes the first layer S1 alone and does not include a second layer S2. The first layer S1 is disposed on the pad electrode PD and projects toward the second substrate SUB2. The first layer S1 contacts the second substrate SUB2. In the example depicted, the first layer S1 is tapered toward the second substrate SUB2. As above, the second spacer SP2 may be a monolayer. At that time, the first layer S1 is formed of the same material used for the first spacer SP1 through the same manufacturing process.

Figure 6:
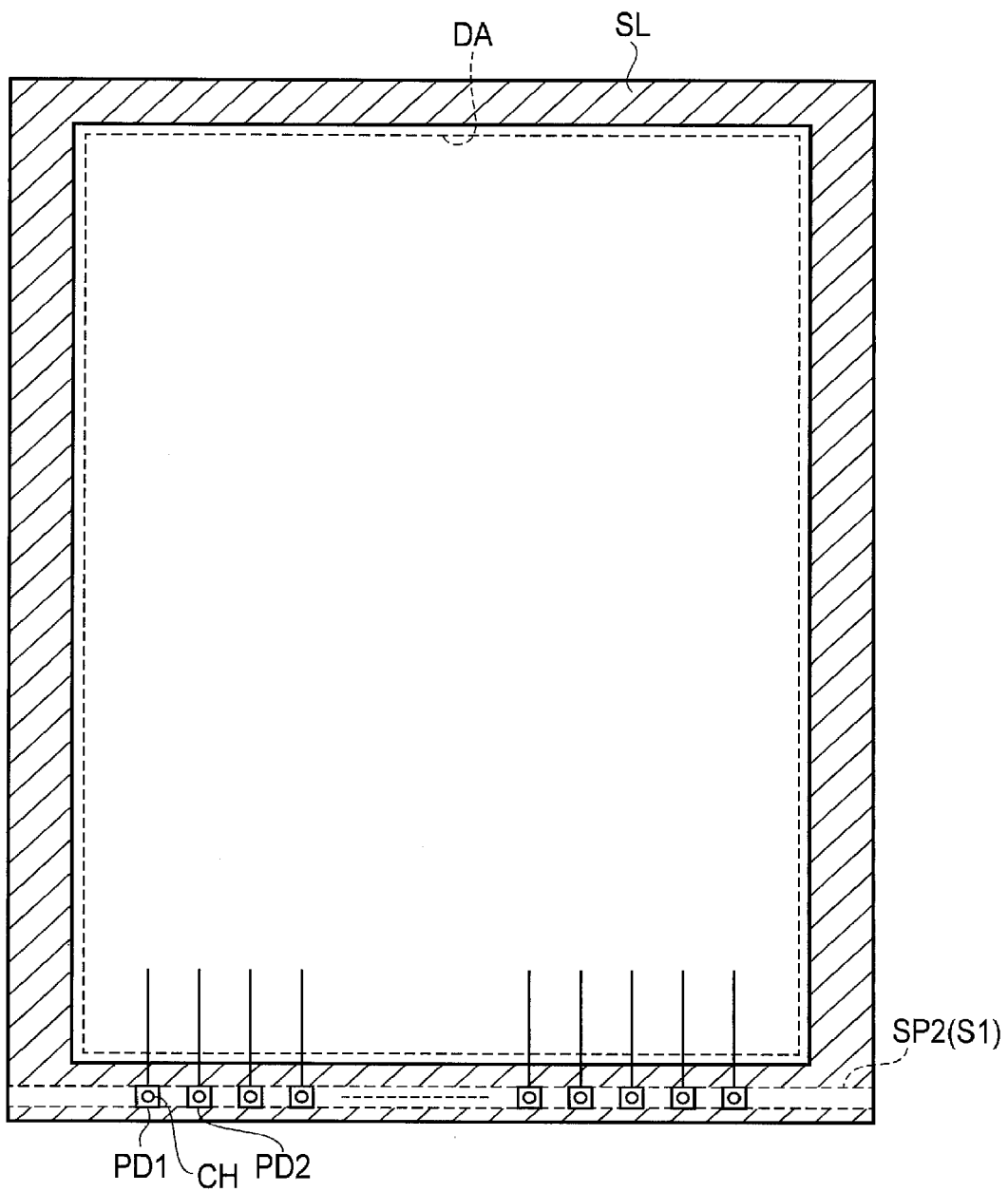
FIG. 6 is a plan view of the first substrate of the embodiment, showing a pad electrode, contact hole, second spacer, and sealant.

FIG. 6 is a plan view of the first substrate SUB1 of the embodiment, showing the pad electrode PD, contact hole CHa, second spacer SP2, and sealant SL.

A plurality of pad electrodes PD and contact holes CHa are arranged in the first direction X in the non-display area NDA in one end SUB1e side of the first substrate SUB1. That is, the pad electrode PD2 is adjacent to the pad electrode PD1. The second spacer SP2 extend in the first direction X in the non-display area NDA in the one end SUB1e side of the first substrate SUB1. The second spacer SP2 overlaps the pad electrodes PD and the contact holes CHa in a plan view. That is, the first layer S1 overlaps the pad electrodes PD1 and PD2 in a plan view. In the example depicted, the sealant SL is disposed in both the inside and the outside the first layer S1.

Figure 7:
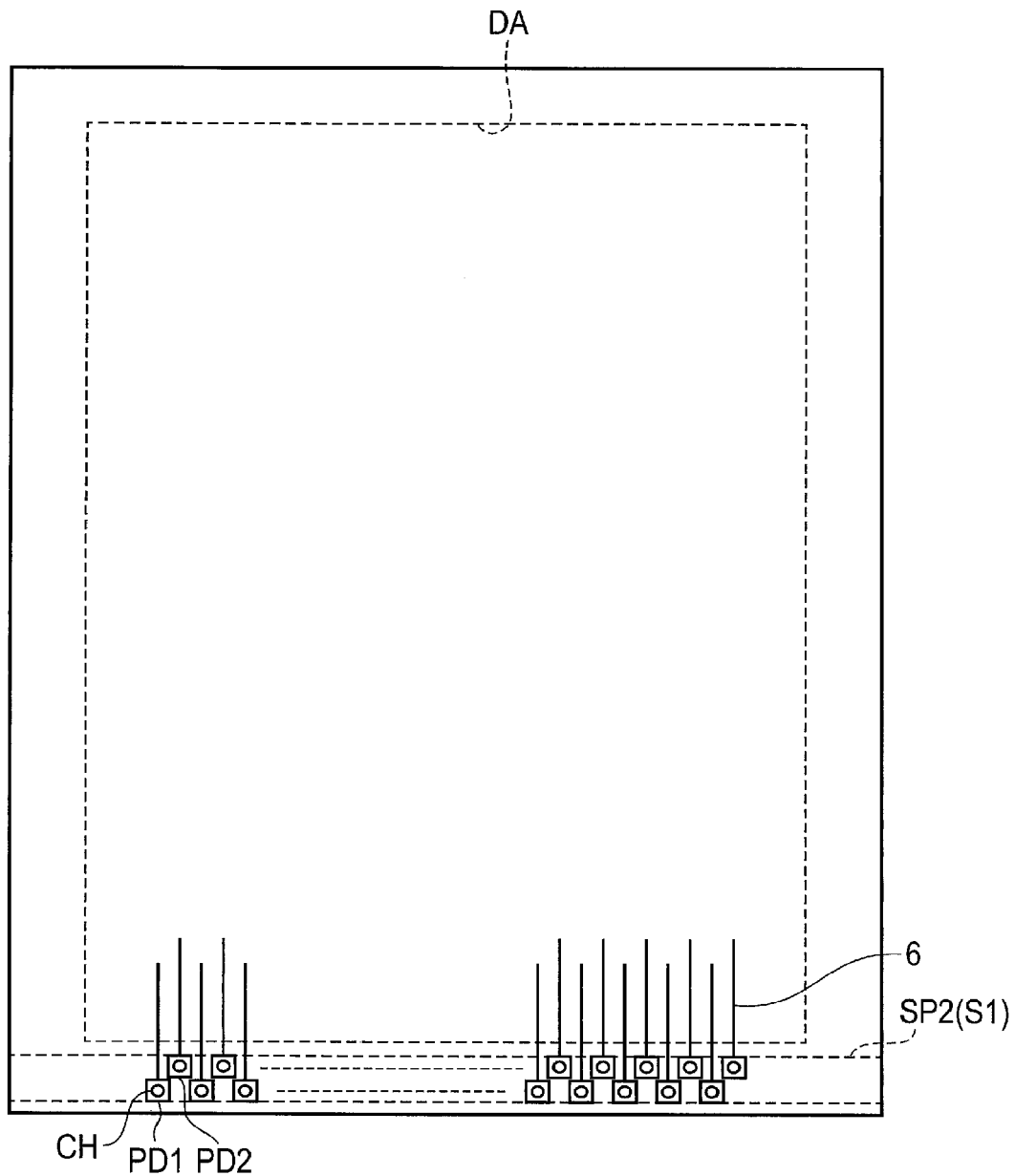
FIG. 7 is a plan view of a variation of the first substrate SUB1 of the embodiment, showing a variation of the pad electrode PD, contact hole CHa, and second spacer SP2.

FIG. 7 is a plan view of a variation of the first substrate SUB1 of the embodiment, showing a variation of the pad electrode PD, contact hole CHa, and second spacer SP2.

The pad electrodes PD, contact holes CHa, and signal lines 6 are disposed in a zigzag arrangement. Such an arrangement of the pad electrodes PD allows a closer-packed arrangement of connection lines and the like in the first direction X. In this variation, a greater number of pad electrodes PD can be disposed as compared to the example of FIG. 6. Since the pad electrodes PD can be disposed in a close-packed arrangement in one location of the one end SUB1e, and the wiring substrate 1 can be miniaturized and made cost-effectively. The second spacer SP2 extends in the first direction X in the non-display area NDA in the one end SUB1 side of the first substrate SUB1. In a plan view, the second spacer SP2 overlaps the pad electrodes PD and contact holes CHa disposed in a zigzag arrangement. That is, the first layer S1 overlaps the pad electrodes PD1 and PD2 in a plan view.

Figure 8:
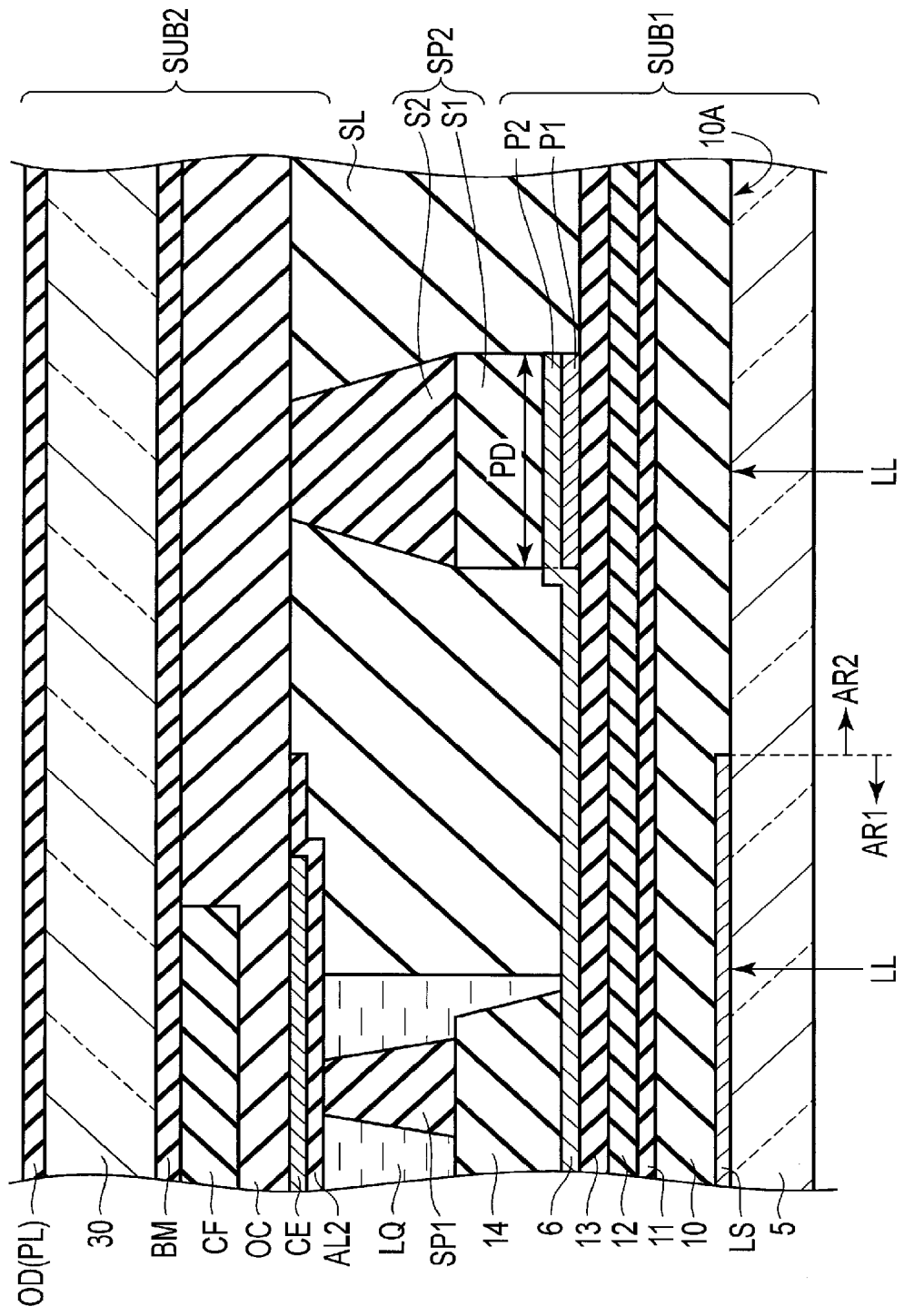
FIG. 8 is a cross-sectional view showing a first process in which the first substrate and the second substrate of the above embodiment are adhered together.
Figure 9:
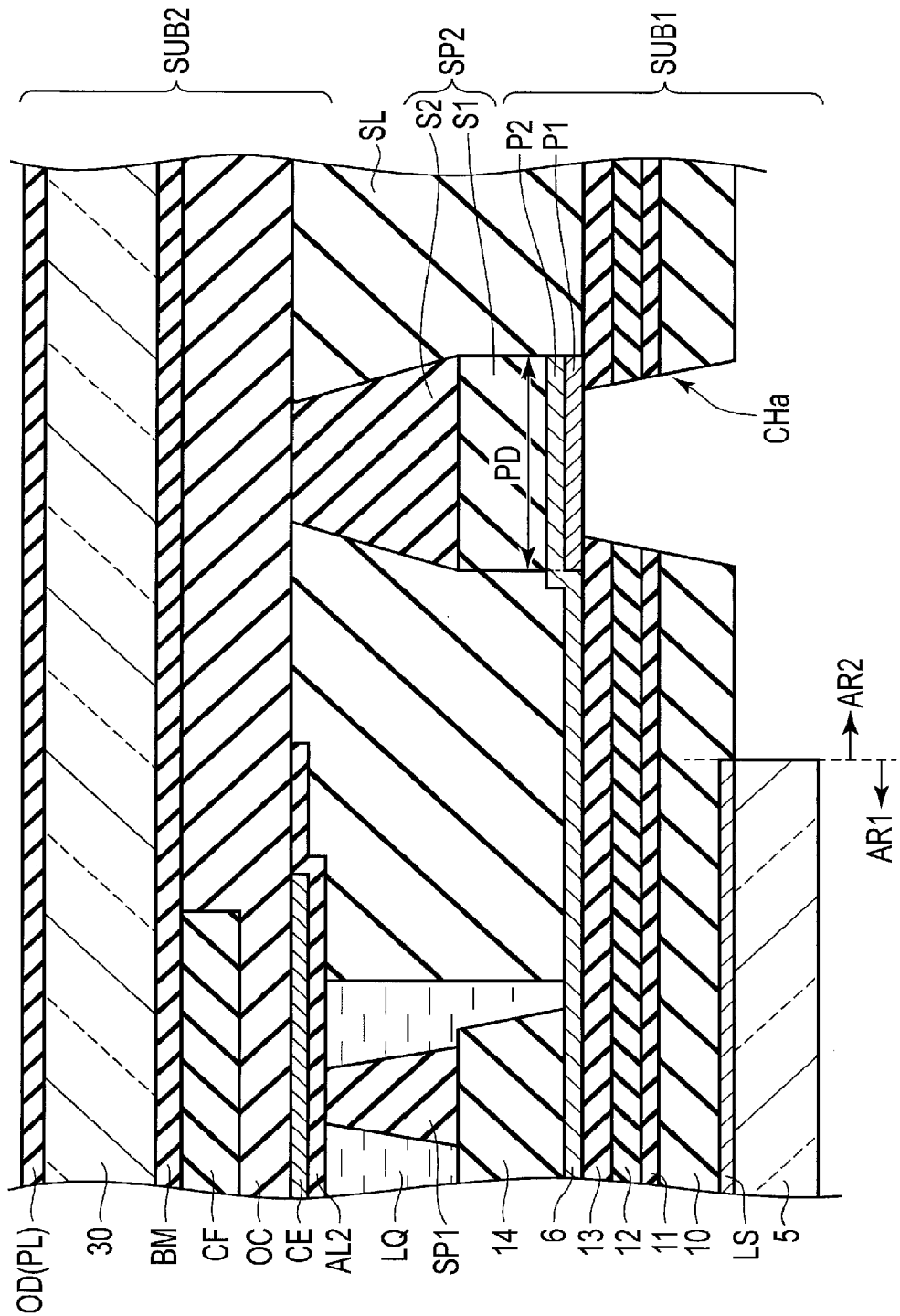
FIG. 9 is a cross-sectional view showing a second process in which the support substrate is partly peeled off from the first insulating substrate and the contact hole is formed in the first substrate after the first process of FIG. 8.
Figure 10:
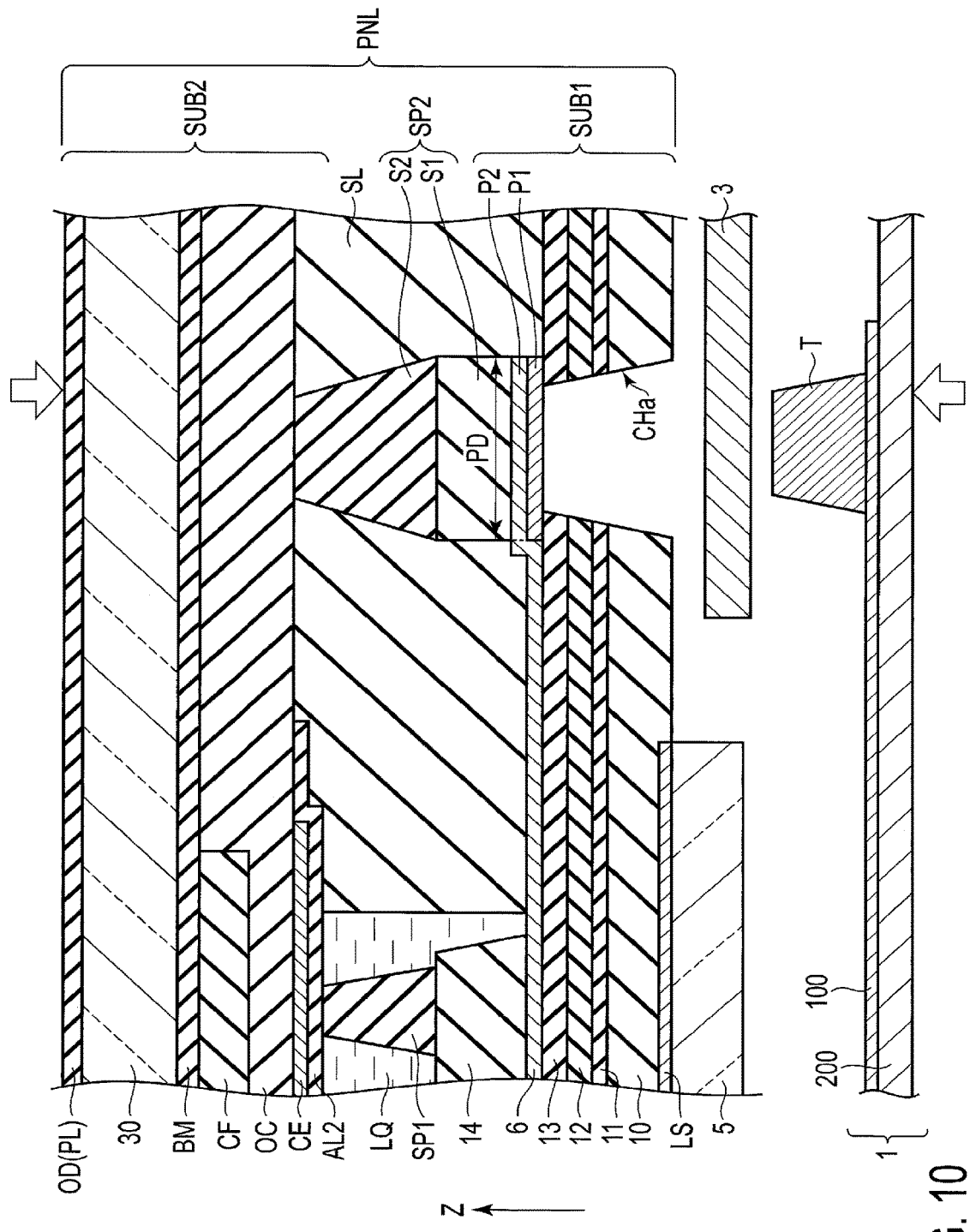
FIG. 10 is a cross-sectional view showing a third process in which the wiring substrate is pressed to the liquid crystal display panel after the second process of FIG. 9.

Now, a manufacturing method of the display device DSP of the present embodiment will be explained with reference to FIGS. 8 to 10. FIGS. 8 to 10 are schematic cross-sectional views each showing a method of pressing the wiring substrate 1 to the liquid crystal display panel PNL in the present embodiment. The structure above the pad electrode PD shown in FIGS. 8 to 10 is the same as that of the liquid crystal display panel PNL of FIG. 4A.

FIG. 8 is a cross-sectional view showing a first process in which the first substrate SUB1 and the second substrate SUB2 of the above embodiment are adhered together.

As shown in FIG. 8, the light shielding mask LS is initially formed on the support substrate 5. The light shielding mask LS is formed in the first area AR1 of the first substrate SUB1. By applying an organic insulating film on the support substrate 5 and the light shielding mask LS, a first insulating substrate 10 is formed. Then, the first insulating film 11, second insulating film 12, third insulating film 13, pad electrode PD, signal line 6, fourth insulating film 14, and first alignment film AL1 are formed one after another. The fourth insulating film 14 is formed on the signal line 6 in the first area AR1 while the first layer S1 is formed on the pad electrode PD in the second area AR2. The first space rSP1 is formed on the fourth insulating film 14 in the first area AR1 while the second layer S2 is formed n the first layer S1 in the second area AR2. Then, the first alignment film AL1 is formed. As above, the first substrate SUB1 and the second substrate SUB2 are formed.

Then, the sealant SL is formed on the first substrate SUB1 or the second substrate SUB2. In the present embodiment, a material of the sealant SL is applied from the above the second spacer SP2 of the first substrate SUB1. A liquid crystal material is dropped into the area surrounded by the sealant SL, and the first substrate SUB1 and the second substrate SUB2 are adhered together.

Note that the sealant SL may be applied inside the second spacer SP2, that is, may be applied closer to the liquid crystal layer LQ side than is the second spacer SP2. In that case, the second spacer SP2 functions as a bank to suppress excessive spread of the sealant SL when the first substrate SUB1 and the second substrate SUB2 are adhered together. Thus, the area of the sealant SL can be reduced and the non-display area NDA can be reduced accordingly. At that time, the sealant SL is, for example, disposed inside the second spacer SP2.

Then, laser LL is irradiated from the rear surface side of the support substrate 5 to partly peel the support substrate 5 from the first insulating substrate 10. Here, in the present embodiment, the support substrate 5 is formed of glass and the first insulating substrate 10 is formed of polyimide. The laser LL irradiated from the rear surface side of the support substrate 5 reaches the surface 10A of the first insulating substrate 10 in the second area AR2. The first insulating substrate 10 absorbs and resolves the laser LL at the interface between the support substrate 5 and the first insulating substrate 10. Thereby, a space is created at the interface between the support substrate 5 and the first insulating substrate 10. At that time, the laser LL does not reach the surface 10A of the first insulating substrate 10 by the light shielding mask LS in the first area AR1, and thus, the interface between the first insulating substrate 10 and the light shielding mask LS is not peeled off.

FIG. 9 is a cross-sectional view showing a second process in which the support substrate 5 is partly peeled off from the first insulating substrate 10 and the contact hole CHa is formed in the first substrate SUB1 after the first process of FIG. 8.

As shown in FIG. 9, after the laser irradiation, the support substrate 5 is fixed to the first insulating substrate 10 through the light shielding mask LS in the first area AR1 while the support substrate 5 is detached from the first insulating substrate 10 in the second area AR2. Then, the support substrate 5 is cut at the boundary between the first area AR1 and the second area AR2 to remove the support substrate 5 from the second area AR2. Note that the position of cutting the support substrate 5 is not limited to the position opposed to the end of the light shielding mask LS. For example, the support substrate 5 may be cut at a position which is apart from the end of the light shielding mask LS and is not opposed to the light shielding mask LS.

After the support substrate 5 is detached from the first insulating substrate in the second area AR2, the contact hole CHa is formed in the first substrate SUB1. Specifically, laser is irradiated from the lower side of the first substrate SUB1 toward Lhe area overlapping the sealant SL, the contact hole CHa is formed through the first insulating film 11, second insulating film 12, third insulating film 13 to reach the contact hole CHa. In the present embodiment, laser with a wavelength of 258 nm or less should be used.

FIG. 10 is a cross-sectional view showing a third process in which the wiring substrate 1 is pressed to the liquid crystal display panel PNL after the second process of FIG. 9.

As shown in FIG. 10, after the formation of the contact hole CHa in the first substrate SUB1, the wiring substrate 1 is pressed to the liquid crystal display panel PNL using the anisotropy conductive film 3. Specifically, the anisotropy conductive film 3 is disposed between the wiring substrate 1 and the liquid crystal display panel PNL to be opposed to the contact hole CHa, and a force is applied from the lower side of the wiring substrate 1 and the upper side of the liquid crystal display panel PNL as shown by arrows in FIG. 10 and heat is applied thereto. Thereby, the anisotropy conductive film 3 melts and permeates into the contact hole CH, and conductive particles included in the anisotropy conductive film 3 contact the pad electrode PD to achieve electrical connection between the wiring substrate 1 and the liquid crystal display panel PNL.

Through the above processes, the wiring substrate 1 is firmly adhered to the liquid crystal display panel PNL.

Figure 11:
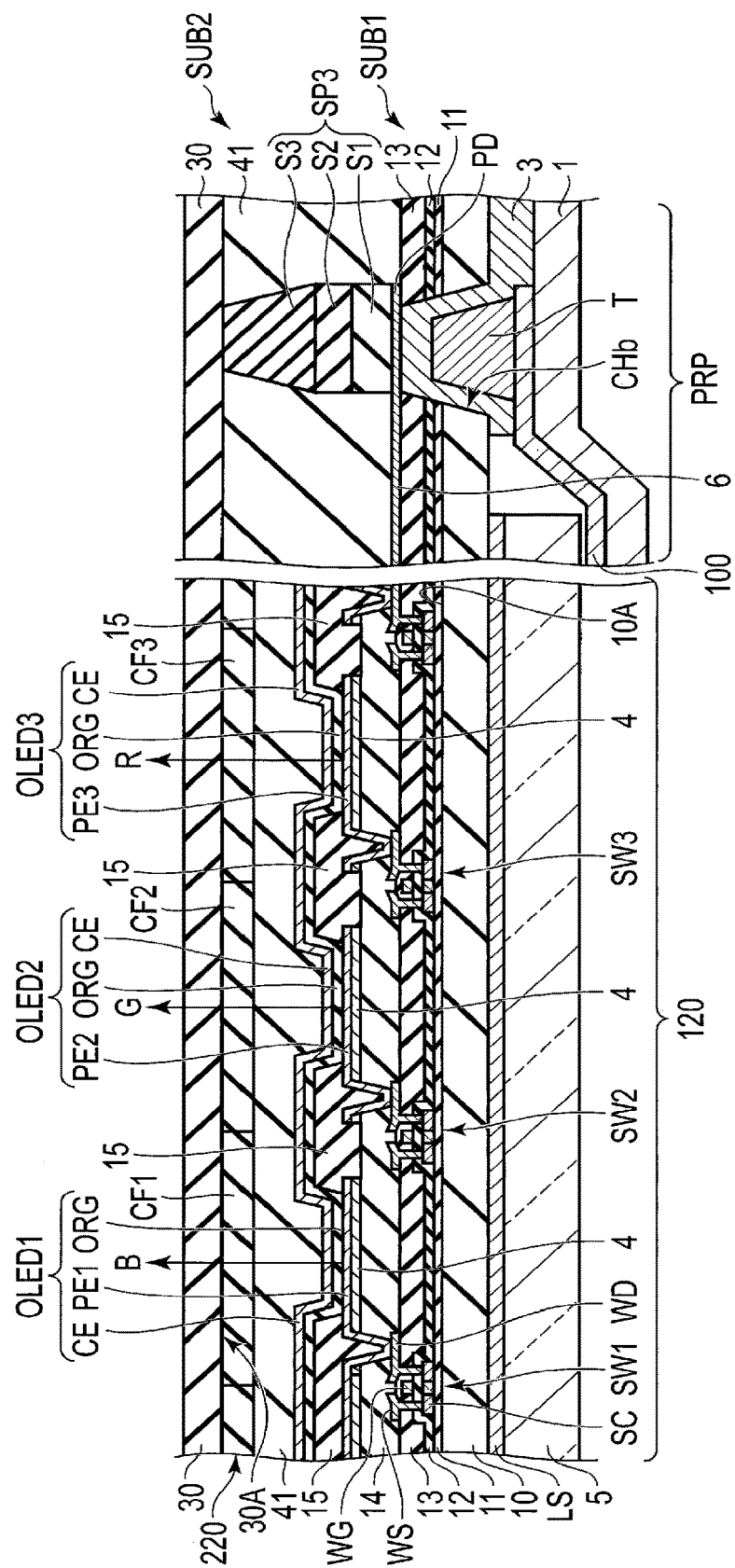
FIG. 11 is a cross-sectional view of another variation of the display device of the embodiment.

FIG. 11 is a cross-sectional view of another variation of the display device DSP of the above embodiment. In the example of FIG. 11, the display device is an organic electroluminescent display device.

Initially, the structure of the display device in a display element part 120 will be explained. Note that elements structured the same as those of the above example will be referred to by the same reference numbers and detailed description thereof will be omitted.

As in FIG. 11, the first substrate SUB1 includes, for example, a support substrate 5, light shielding mask LS, first insulating substrate 10, switching elements SW1, SW2, and SW3, and organic electroluminescent (EL) elements OLED1, OLED2, and OLED3. The light shielding mask LS is disposed between the support substrate 5 and the first insulating substrate 10. Switching elements SW1 to SW3 are formed on the first insulating film 11. The reflective layer 4 is formed on the fourth insulating film 14.

Organic EL elements (light emitting elements) OLED1 to OLED3 are disposed between the first substrate SUB1 and the second substrate SUB2. Furthermore, the organic EL elements OLED1 to OLED3 are formed on the fourth insulating film 14. In the example depicted, the organic EL element OLED1 is electrically connected to the switching element SW1, the organic EL element OLED2 is electrically connected to the switching element SW2, and the organic EL element OLED3 is electrically connected to the switching element SW3. Each of the organic EL elements OLED1 to OLED3 is structured as a top-emission type which emits whit light toward the second substrate SUB2. The organic EL elements OLED1 to OLED3 have the same structure.

The organic EL elements OLED1 includes a positive electrode PE1 formed on the reflective layer 4. The positive electrode PE1 contacts the drain electrode WD of the switching element SW1 and is electrically connected to the switching element SW1. Similarly, the organic EL element OLED2 includes a positive electrode PE2 which is electrically connected to the switching element SW2 and the organic EL element OLED3 includes a positive electrode PE3 which is electrically connected to the switching element SW3.

The organic EL elements OLED1 to OLED3 each include an organic light emitting layer ORG and a common electrode (negative electrode) CE. The organic light emitting layer ORG is disposed to correspond to each of the positive electrodes PE1 to PE3. The common electrode CE is positioned above the organic light emitting layer ORG. In the example depicted, the organic EL elements OLED1 to OLED3 are defined by ribs 15. Note that, although this is not depicted, each of the organic EL elements OLED1 to OLED3 is, preferably, sealed by a transparent shielding film.

The display element part 120 is an area of the first substrate SUB1 in which a plurality of switching elements and organic EL elements OLED are arranged, and thus, the display element part 120 is a substantial display area for the image display.

The second substrate SUB2 includes a color filter layer 220 and the like on the inner surface 30A side of the second insulating substrate 30. The color filter layer 220 includes color filters CF1, CF2, and CF3. The color filter CF1 is opposed to the organic EL element OLED1 and is a blue color filter which passes light of blue wave length in white light. The color filter CF2 is opposed to the organic EL element OLED2 and is a green color filter which passes light of green wave length in white light. The color filter CF3 is opposed to the organic EL element OLED3 and is a red color filter which passes light of red wave length in white light.

The display element part 120 of the first substrate SUB1 and the second substrate SUB2 are adhered by a transparent adhesive layer 41.

In the above display device, when the organic EL elements OLED1 to OLED3 emit light, the light (white light) irradiated from the elements OLED1 to OLED3 exits through the color filters CF1, CF2, and CF3. Therein, the light of blue wave length in the white light irradiated from the organic EL element OLED1 passes the color filter CF1. Additionally, the light of green wave length in the white light irradiated from the organic EL element OLED2 passes the color filter CF2, and the light of red wave length in the white light irradiated from the organic EL element OLED3 passes the color filter CF3. Therefore, color image display can be achieved.

Now, the structure of the display device in a bezel area PRP will be explained.

The first substrate SUB1 includes, for example, the support substrate 5, light shielding mask LS, first insulating substrate 10, pad electrode PD, signal line 6, and third spacer SP3. A contact hole CHb is formed to pass through the first insulating substrate 10, first insulating film 11, second insulating film 12, and third insulating film 13 to reach the pad electrode PD. The contact hole CHb corresponds to a through hole. The signal line 6 is disposed on the third insulating film 13 in the same layer in which the pad electrode PD is disposed.

The third spacer SP3 is disposed on the pad electrode PD. The third spacer SP3 includes the first layer S1, second layer S2, and third resin layer S3. In the example depicted, the first layer S1 is disposed on the pad electrode PD, the second layer S2 is disposed on the first layer S1, and the third resin layer S3 is disposed on the second layer S2. The first layer S1 is formed of the same material used for the fourth insulating film 14 through the same manufacturing process. The second layer S2 is formed of the same material used for, for example, the first spacer SP1 through the same manufacturing process. The third insulating layer S3 is formed of the same material used for, for example, the spacer formed in the display element part 120 through the same manufacturing process. Note that the adhesive layer 41 is disposed in both the inside and the outside the first layer S1 as with the sealant SL of FIG. 6.

The wiring substrate 1 is disposed in the rear surface side of the first substrate SUB1. The pad electrode PD and the connection line 100 of the wiring substrate 1 are electrically connected to each other through the anisotropy conductive film 3. The same advantages obtained in the above embodiment can be achieved in such an organic EL display device of above variation.

As can be understood from the above, the present embodiment can achieve a compact and thin-bezel display device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
   a first substrate including an insulating substrate with a through hole, a first pad electrode disposed above the insulating substrate, and a signal line electrically connected to the first pad electrode;
   a second substrate disposed to be opposed to the first substrate;
   a first layer disposed between the first pad electrode and the second substrate;
   a wiring substrate including a connection line and disposed below the insulating substrate; and
   a conductive material disposed within the through hole to electrically connect the first pad electrode and the connection line, wherein
   the through hole is formed in a position overlapping the first layer, and
   the connection line has a first Young's modulus, the first layer has a second Young's modulus, the conductive material has a third Young's modulus, where the first Young's modulus is greater than the third Young's modulus and is less than the second Young's modulus.

2. The display device of claim 1, further comprising a spacer including the first layer and a second layer disposed on the first layer.

3. The display device of claim 1, wherein the first layer is formed in the first substrate.

4. The display device of claim 2, wherein the second layer contacts the second substrate.

5. The display device of claim 4, wherein the second layer is tapered.

6. The display device of claim 1, wherein the first layer contacts the second substrate.

7. The display device of claim 6, wherein the first layer is tapered.

8. The display device of claim 1, wherein the first substrate further includes a first area, a second area adjacent to the first area, and a support substrate disposed in the first area.

9. The display device of claim 1, wherein the first pad electrode include a first electrode contacting the conductive material, and the first electrode is formed of a transparent conductive layer.

10. The display device of claim 9, wherein the first pad electrode includes a second electrode disposed on the first electrode, and the second electrode is formed of a metal material.

11. The display device of claim 1, further comprising a light emitting element disposed between the first substrate and the second substrate, and an adhesive layer which adheres the first substrate and the second substrate, wherein the adhesive layer is positioned inside the first layer in a plan view.

12. The display device of claim 11, wherein the adhesive layer is positioned outside the first layer in a plan view.

13. The display device of claim 1, further comprising a liquid crystal layer held between the first substrate and the second substrate, and a sealant which adheres the first substrate and the second substrate, wherein the sealant is positioned inside the first layer in a plan view.

14. The display device of claim 13, wherein the sealant is positioned outside the first layer in a plan view.

15. The display device of claim 1, wherein a sealant is interposed between the first layer and the second substrate.

16. The display device of claim 1, wherein the first substrate includes an insulating film formed of a material used for the first layer.

17. The display device of claim 1, further comprising a second pad electrode adjacent to the first pad electrode, wherein the first pad electrode and the second pad electrode overlap the first layer in a plan view.

* * * * *